United States Patent
Selwyn et al.

(10) Patent No.: US 6,262,523 B1
(45) Date of Patent: *Jul. 17, 2001

(54) LARGE AREA ATMOSPHERIC-PRESSURE PLASMA JET

(75) Inventors: Gary S. Selwyn; Ivars Henins, both of Los Alamos, NM (US); Steve E. Babayan, Huntington Beach; Robert F. Hicks, Los Angeles, both of CA (US)

(73) Assignee: The Regents of the University of California, Los Alamos, NM (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,942

(22) Filed: Apr. 21, 1999

(51) Int. Cl.$^7$ .................................................. H01J 7/24

(52) U.S. Cl. .............................. 313/231.31; 313/231.71; 313/35; 313/46; 315/111.21; 315/111.41; 315/111.71; 315/111.91

(58) Field of Search ................... 313/231.31, 231.71, 313/362.1, 46, 35, 36, 44; 315/111.21, 111.41, 111.71, 111.91, 111.81

(56) References Cited

U.S. PATENT DOCUMENTS

| | | |
|---|---|---|
| 5,198,724 | 3/1993 | Koinuma et al. ............... 315/111.21 |
| 5,272,414 * | 12/1993 | Iwanaga ............................ 313/231.41 |
| 5,369,336 | 11/1994 | Koinuma et al. ............... 315/111.21 |
| 5,403,453 | 4/1995 | Roth et al. ........................... 204/164 |
| 5,414,324 | 5/1995 | Roth et al. ...................... 315/111.21 |
| 5,456,972 | 10/1995 | Roth .................................... 428/224 |

OTHER PUBLICATIONS

Y. Sawada et al., J. Phys. D: Appl. Phys. 28, 1661 (1995).
T. Yokoyama et al., J. Phys. D: Appl. Phys. 23, 1125 (1990).
H. Ha et al., J. Electrochem. Soc. 142, 2726 (1995).
K. Inomata et al., Appl. Phys. Lett. 64, 46 (1994).
H. Koinuma et al., Appl. Phys. Lett. 60, 816 (1992).
H. S. Uhm et al., Proceedings of the 1997 IEEE International Conference on Plasma Science, May 19–22, 1997, San Diego (IEEE, New York, 1997), p. 152.
A. Matsubara et al., Jap. J. Appl. Phys., Part 1, 35, 4541 (1996).
E. Nasser, Fundamentals of Gaseous Ionization and Plasma Electronics, Wiley–Interscience, New York, 1971.

(List continued on next page.)

Primary Examiner—Ashok Patel
(74) Attorney, Agent, or Firm—Samuel M. Freund

(57) ABSTRACT

Large area atmospheric-pressure plasma jet. A plasma discharge that can be operated at atmospheric pressure and near room temperature using 13.56 MHz rf power is described. Unlike plasma torches, the discharge produces a gas-phase effluent no hotter than 250° C. at an applied power of about 300 W, and shows distinct non-thermal characteristics. In the simplest design, two planar, parallel electrodes are employed to generate a plasma in the volume therebetween. A "jet" of long-lived metastable and reactive species that are capable of rapidly cleaning or etching metals and other materials is generated which extends up to 8 in. beyond the open end of the electrodes. Films and coatings may also be removed by these species. Arcing is prevented in the apparatus by using gas mixtures containing He, which limits ionization, by using high flow velocities, and by properly spacing the rf-powered electrode. Because of the atmospheric pressure operation, there is a negligible density of ions surviving for a sufficiently long distance beyond the active plasma discharge to bombard a workpiece, unlike the situation for low-pressure plasma sources and conventional plasma processing methods.

15 Claims, 3 Drawing Sheets

OTHER PUBLICATIONS

M. Goldman et al., Gaseous Electronics, vol. 1, edited by M.N. Hirsh and H. J. Oskam (Academic Press, New York, 1978), p. 219–290.

R. S. Sigmond et al., Electrical Breakdown and Discharges in Gases, Part B, edited by E. E. Kunhardt and L. H. Luessen (Plenum Publishing Co., New York, 1983), p. 1–64.

A. C. Adams et al., "Reduced Temperature Processing for VLSI," Electrochemical Society, Penington, NJ, 1986.

F. S. Becker et al., J. Vac. Sci. Technol. B5, 1555 (1987).

M. F. Ceiler, Jr., et al., J. Electrochem. Soc. 142, 2067 (1995).

K. Ikeda et al., J. Electrochem. Soc. 143, 1715 (1996).

K. Murase, Jap. J. Appl. Phys. 33, 1385 (1994).

W. J. Patrick et al., J. Electrochem. Soc. 139, 2604 (1992).

S. K. Ray et al., Adv. Mater. For Optics and Electronics 6, 73(1996).

M. A. Liebermann et al., Principles of Plasma Discharges and Materials Processing, pp. 367–368 (1994).

N. A. Yatensko, "Integral Characteristics of Electrode Layers in a Capacitive Medium–Pressure hf Discharge", Russian Original 20, No. 4, Jul.–Aug., 1982.

Yu P. Raizer et al., "Radio–Frequency Capacitive and Gas lasers with RF Excitation", Gas Lasers–Recent Developments and Future Prospects, 37–54 (Dec. 1996).

* cited by examiner

SECTION B-B

SECTION A-A

SECTION B-B

SECTION A-A

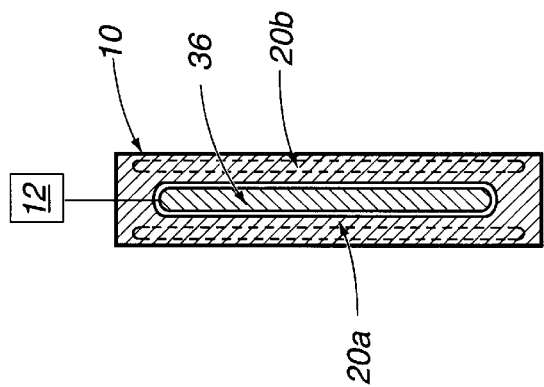
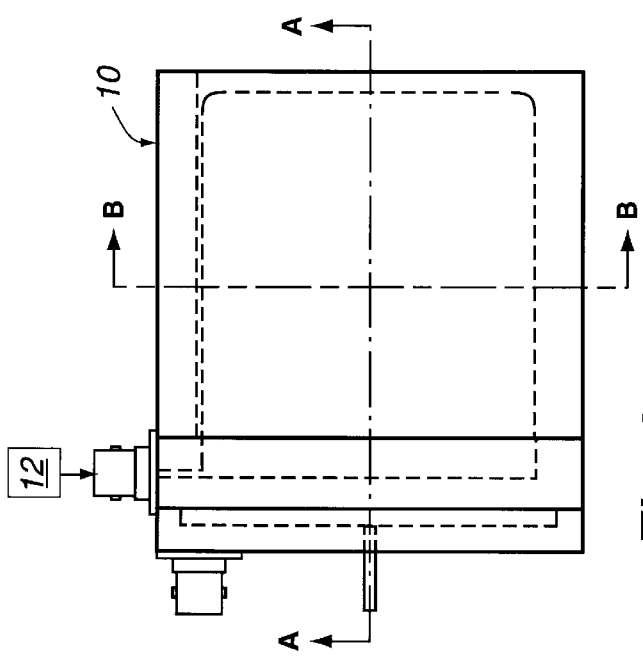
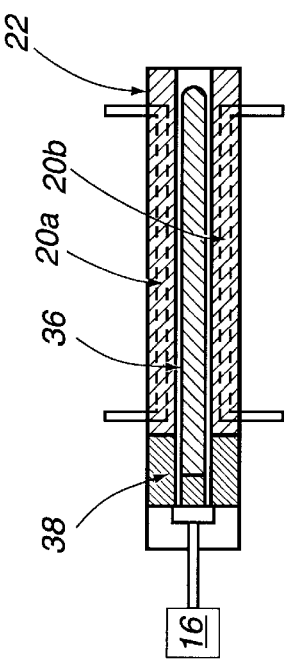

LARGE AREA ATMOSPHERIC-PRESSURE PLASMA JET

FIELD OF THE INVENTION

The present invention relates generally to the generation of plasma discharges and, more particularly, to an apparatus for generating large-area atmospheric-pressure plasmas suitable for materials processing, solvent-free surface cleaning and decontamination. This invention was made with government support under Contract No. W-7405-ENG-36 awarded by the U.S. Department of Energy to The Regents of the University of California. The government has certain rights in the invention.

BACKGROUND OF THE INVENTION

Plasmas and plasma generation has been studied for many years. There are several types of plasma generators currently employed for numerous applications. The well-known, atmospheric-pressure dielectric-barrier discharge is not a stable, continuous and homogeneous plasma; rather it is a series of short-lived, self-terminating arcs. This discharge generation system includes two parallel electrodes with a solid dielectric insulating layer on one of the electrodes. The dielectric layer serves to ensure termination of an arc. Substrates to be treated in such a discharge suffer local damage from the short-lived arcs (See, e.g., Y. Sawada et al., J. Phys. D: Appl. Phys. 28, 1661 (1995) and T. Yokoyama et al., J. Phys. D: Appl. Phys. 23, 1125 (1990)).

Microbeam plasma generators also require a dielectric material (quartz tube) between the inner and outer electrodes. Such microbeam devices operate at low power with high plasma gas flow velocities. The small deposition spot size created by the microbeam plasma generator can give rise to misleading deposition rates, and scale-up is likely difficult (See, e.g., H. Ha et al., J. Electrochem. Soc. 142, 2726 (1995), K. Inomata et al., Appl. Phys. Left. 64, 46 (1994), and H. Koinuma et al., Appl. Phys. Lett. 60, 816 (1992)).

Plasma torches are also referred to as thermal or arc discharges. These processes have been successfully utilized in the plasma spray metal coating industry. However, operating temperatures often exceed 10,000 Kelvin which is unacceptable in many situations (See, e.g., H. S. Uhm et al., Proceedings of the 1997 IEEE International Conference on Plasma Science, May 19–22, 1997, San Diego (IEEE, New York, 1997), p. 152, and A. Matsubara et al., Jap. J. Appl. Phys., Part. 1 35, 4541 (1996)).

Corona discharges have small exposed excitation area; thus, the quantity of generated reactive species is too small for industrial applications (See, e.g., E. Nasser, *Fundamentals of gaseous Ionization and Plasma Electronics*, Wiley-Interscience, New York, 1971, M. Goldman et al., *Gaseous Electronics*, Vol. 1, edited by M. N. Hirsh and H. J. Oskam (Academic Press, New York, 1978), p. 219–290, and R. S. Sigmond et al., *Electrical Breakdown and Discharges in Gases*, Part B, edited by E. E. Kunhardt and L. H. Luessen (Plenum Publishing Co., New York, 1983), p.1–64).

Low pressure plasmas are commonly used in the semiconductor industry for deposition, etching and ashing. This type of plasma requires a vacuum chamber with an expensive pumping system. In addition, the low pressure permits generated ions to impact the substrate which can damage underlying substrate layers and increase the substrate temperature (See, e.g., A. C. Adams et al., "Reduced Temperature Processing for VLSI," Electrochemical Society, Penington, N.J., 1986, F. S. Becker et al., J. Vac. Sci. Technol. B5, 1555 (1987), M. F. Ceiler, Jr., et al., J. Electrochem. Soc. 142, 2067 (1995), K. Ikeda et al., J. Electrochem. Soc. 143, 1715 (1996), K. Murase, Jap. J. Appl. Phys. 33, 1385 (1994), W. J. Patrick et al., J. Electrochem. Soc. 139, 2604 (1992), and S. K. Ray et al., Adv. Mater. For Optics and Electronics 6, 73 (1996)).

In U.S. Pat. No. 5,414,324 for "One Atmosphere, Uniform Glow Discharge Plasma," which issued to John R. Roth et al. on May 9, 1995, a one-atmosphere, steady-state glow discharge plasma is generated within the volume between a pair of insulated, equally spaced planar metal electrodes energized with an rms potential of 1–5 kV at 1–100 kHz is described. Roth et al. states that glow discharge plasmas are produced by free electrons which are energized by imposed direct current or rf electric fields. These electrons collide with neutral molecules transferring energy thereto, thereby forming a variety of active species which may include metastables, atomic species, free radicals, molecular fragments, monomers, electrons, and ions. An environmental isolation enclosure in which a low feed gas flow is maintained surrounds the plate assembly in order to equal the leakage rate of the enclosure. In fact, a no flow condition is taught for normal operation of the apparatus. Materials may be processed by passing them through the plasma between the electrodes, where they are exposed to all plasma constituents including ions. See, e.g., U.S. Pat. No. 5,403,453 for "Method And Apparatus For Glow Discharge Plasma Treatment Of Polymer Materials At Atmospheric Pressure," which issued to John R. Roth et al. on Apr. 4, 1995, and U.S. Pat. No. 5,456,972 for "Method And Apparatus For Glow Discharge Plasma Treatment Of Polymer Materials At Atmospheric Pressure," which issued to John R. Roth on Oct. 10, 1995.

Two patents by Hideomi Koinuma et al.: "Plasma Processing Method And Plasma Generating Device" which issued as U.S. Pat. No. 5,198,724 on Mar. 30, 1993 and "Plasma Generating Device" which issued as U.S. Pat. No. 5,369,336 on Nov. 29, 1994, describe a plasma generating device that includes a central electrode, a peripheral cylindrical electrode surrounding the central conductor, and an insulating cylinder interposed between the electrodes in order to prevent direct arc discharge from occurring therebetween. The electrodes and the insulating cylinder are coaxially arranged in order to define a cylindrical discharging space therein. By applying high-frequency electrical energy to the central electrode, a glow discharge is caused to occur between the central electrode and the insulating cylinder. A reactive gas is introduced from one end of the discharge space, excited by the glow discharge and exits from the other end as an excited plasma impinging on a work piece to be processed by the plasma. The Koinuma et al. apparatus cannot be scaled to large dimensions since the insulating cylinder must remain thin because it is required to conduct the radiofrequency discharge current. Further, the dielectric material is subject to attack by the reactive gases, and introduces a phase lag which requires that higher voltages and lower currents must be employed to maintain the discharge.

Accordingly, it is an object of the present invention to provide an apparatus for generating significant quantities of nonionic reactive species for materials processing over a large area outside of the plasma.

Another object of the invention is to provide an apparatus for generating significant quantities of nonionic reactive species for materials processing over a large area outside the plasma at atmospheric pressure.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects and, in accordance with the purposes of the present invention as embodied and broadly described herein, the apparatus for generating an atmospheric-pressure plasma discharge hereof includes: a chamber having two opposing planar, spaced-apart and parallel grounded electrically conducting walls, a closed end, and an open end; a planar, electrically conducting electrode located within the chamber disposed such that the planar electrode is equally distant from and parallel to the opposing electrically conducting walls thereof, defining thereby two volumes; means for flowing gases through each of the two volumes; and means for supplying rf energy to the planar electrode such that a continuous plasma discharge occurs between the planar electrode and each of the grounded electrically conducting walls of the chamber, the gaseous products of the plasma discharge exiting through the open end of the chamber at ambient pressure.

In another aspect of the present invention in accordance with its objects and purposes, the apparatus for generating a gaseous jet containing concentrations of reactive species from an atmospheric pressure plasma discharge hereof includes: an electrically conducting chamber having a planar, grounded electrically conducting wall, a closed end and an open end; a planar, conducting electrode located within the chamber disposed such that said planar electrode is spaced apart from and parallel to the planar, grounded electrically conducting wall of the chamber, thereby defining a volume; means for flowing gases through the volume; and means for supplying rf energy to the planar electrode such that a continuous plasma discharge occurs between the planar electrode and the grounded electrically conducting wall of the chamber, the gaseous products of the plasma discharge exiting through the open end of the chamber at ambient pressure.

In yet another embodiment of the present invention in accordance with its objects and purposes, the method for generating a gaseous jet containing concentrations of reactive species hereof includes generating an homogeneous, atmospheric-pressure plasma discharge having no visibly observable arcs in a gas flowing through the region between a planar, electrically conducting wall of a chamber having a closed end and an open end, and a planar, electrically conducting rf-powered electrode located within the chamber spaced apart from and parallel to the planar, electrically conducting wall thereof, thereby forming a volume therebetween, whereby gaseous products of the plasma discharge, including reactive species, exit through the open end of the chamber at ambient pressure.

Benefits and advantages of the present invention include the generation of an intense stream of reactive species for interacting with substrates without exposing the substrates to ions or to a high-temperature source both of which generally cause substrate deterioration. The plasma jet operates at atmospheric pressure, so that complex and expensive vacuum chambers are not required.

BRIEF DESCRIPTION OF THE DRAWINGS

The accompanying drawings, which are incorporated in and form a part of the specification, illustrate two embodiments of the present invention and, together with the description, serve to explain the principles of the invention. In the drawings:

FIG. 1b is a sectional view (Section B—B) of the apparatus from the front end thereof, while

FIG. 2b is a sectional view (Section B—B) of the apparatus from the front end thereof, while

FIG. 3a is a schematic representation of a side sectional view (Section A—A) of the cantilever-mounted, planar, solid-plate center electrode, large-area atmospheric-pressure plasma jet embodiment of the present invention, FIG. 3b is a sectional view (Section B—B) of the apparatus from the front end thereof, while FIG. 3c is a top view thereof showing, in particular, the sectioning.

DETAILED DESCRIPTION OF THE INVENTION

Briefly, the present invention includes an apparatus for generating a large-area plasma discharge at atmospheric pressure which can be used to etch or clean materials on a large scale. Although not limited by this width the apparatus constructed according to the teachings of the invention can treat surfaces 4 in. across. In principle, an atmospheric-pressure plasma jet of large size (i.e., 1 meter or larger and capable of handling tens of kilowatts of power) can readily be constructed. The plasma discharge can be operated at atmospheric pressure and approximately room temperature using 13.56 MHz rf power. Unlike plasma torches, the discharge produces a gas-phase effluent no hotter than 250° C. at an applied power of about 300 W which exhibits distinct non-thermal characteristics. In one embodiment, two parallel planar electrodes are employed to generate a plasma in the region therebetween. A "jet" of long-lived metastable and reactive species that are capable of rapidly cleaning or etching metals and other materials is generated which extends up to 8 in. beyond the open end of the electrodes. Films and coatings may also be removed by these species. Arcing is prevented in the apparatus by using gas mixtures containing He, which limits ionization, by using high flow velocities, and by properly shaping the rf-powered electrode. Because of the atmospheric pressure operation, no ions survive for a sufficiently long distance beyond the active plasma discharge to bombard a workpiece, unlike low-pressure plasma sources and conventional plasma processing methods. Additionally, the metastable and radical species must diffuse to the surface for an etching reaction to occur, thereby ensuring isotropic etching of the material. The key to the successful operation of the plasma jet is: (1) Generation of electrons at rates exceeding loss of electrons by collisional and wall processes; (2) Limiting arcing by maintenance of a high impedance plasma; and (3) Generation of reactive metastable species and atoms that persist for sufficient time to travel from the jet to the target surface, even at atmospheric pressure.

Polyimide films are etched nearly 30 times faster with an $O_2$/He mixture in the apparatus of the present invention than with conventional low-pressure plasmas using the same feed gas. The present invention can be used to selectively etch surfaces; that is, the reactive species generated using the $O_2$/He plasma mixture have been found not to significantly etch metal or glass surfaces. Improved selectivity results from chemical etch processes which occur without ion bombardment; that is, although ions are formed inside the plasma discharge, no significant ion density has been observed to exit the present apparatus.

Figure 1B:
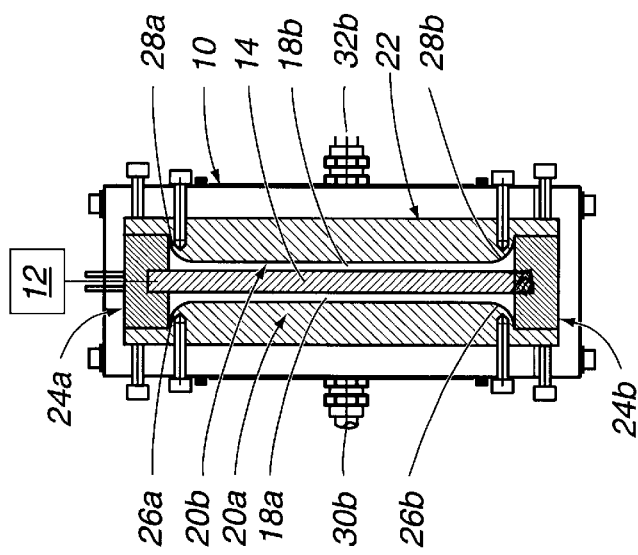
Figure 1C:
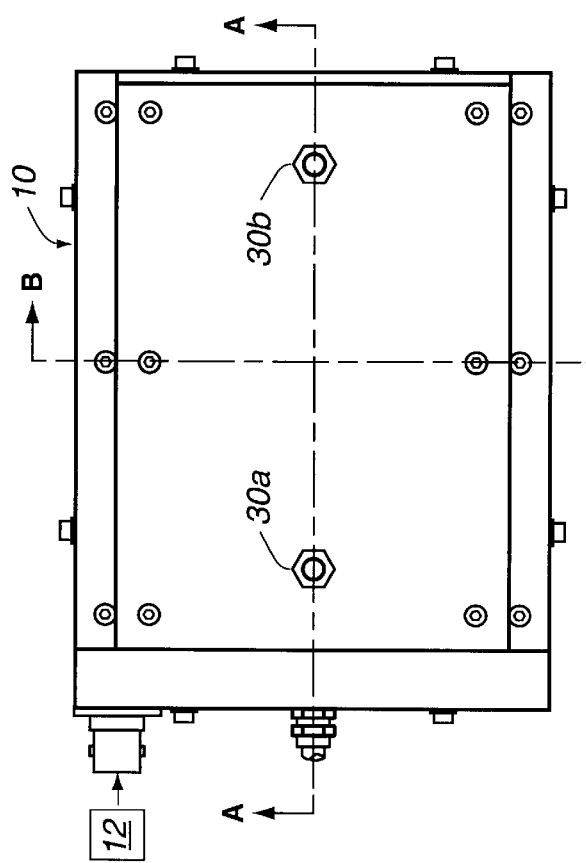
FIG. 1c is a top view thereof showing, in particular, the sectioning.
Figure 1A:
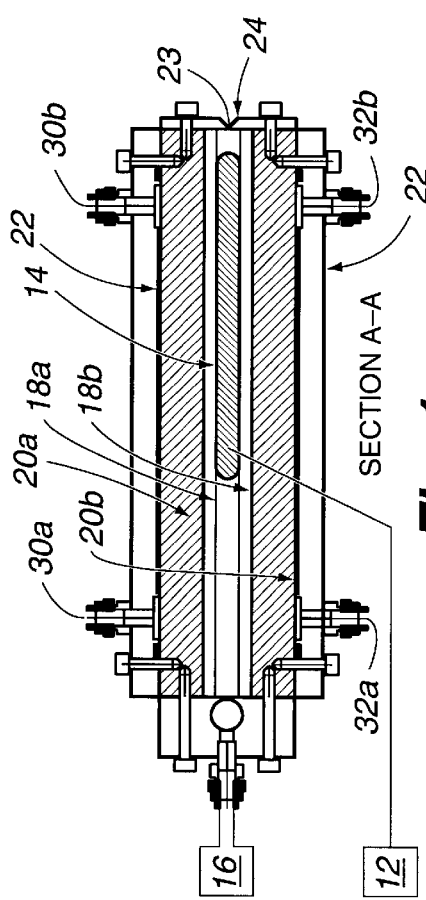
FIG. 1a is a schematic representation of a side sectional view (Section A—A) of the fully supported, planar, solid-plate center electrode, large-area atmospheric-pressure plasma jet embodiment of the present invention.
Figure 2B:
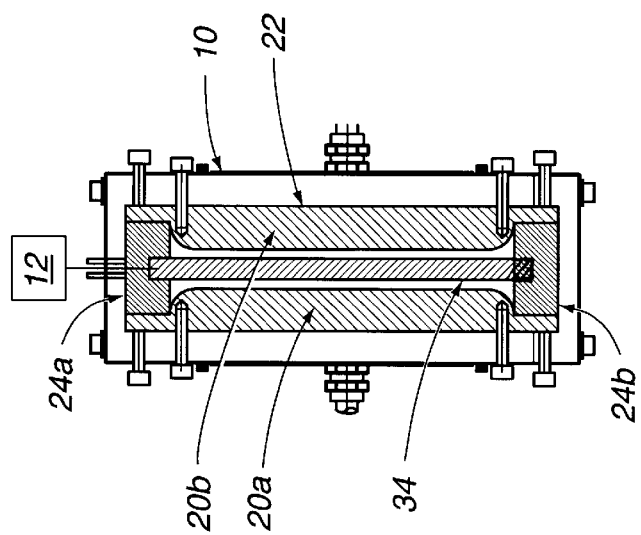
Figure 2C:
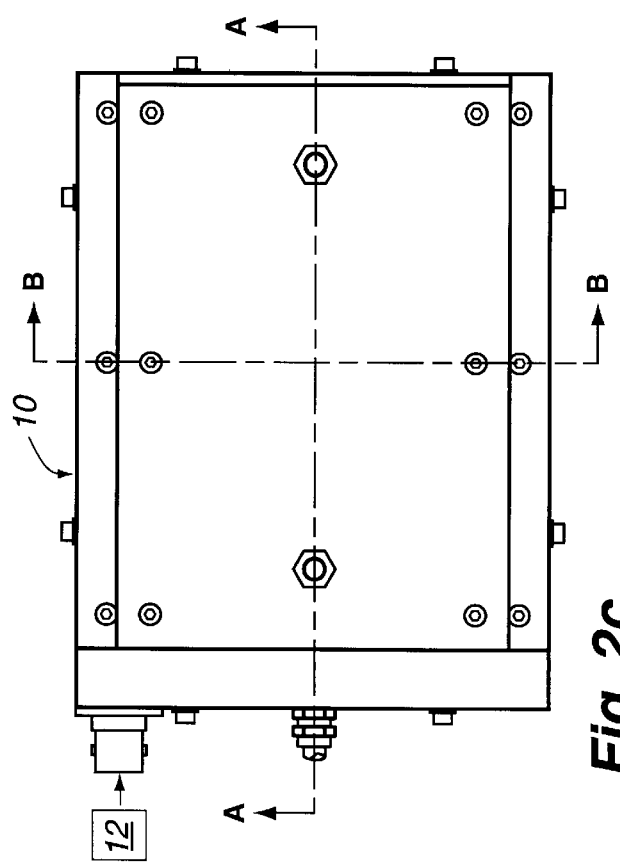
FIG. 2c is a top view thereof showing, in particular, the sectioning.
Figure 2A:
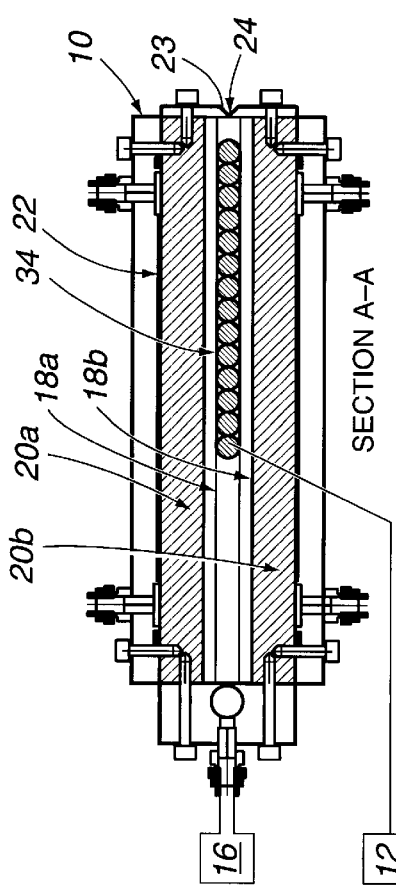
FIG. 2a is a schematic representation of a side sectional view (Section A—A) of the multiple-rod center electrode, large-area atmospheric-pressure plasma jet embodiment of the present invention.

Reference will now be made in detail to the present preferred embodiments of the invention, examples of which are illustrated in the accompanying drawings. Identical callouts are used to depict similar or identical structure. Turning to the drawings, FIG. 1a is a schematic representation of a side sectional planar view (Section A—A) of the fully supported, planar, solid-plate center electrode embodiment of the apparatus of the present invention, 10. Capacitively-coupled, rf source, 12, which operates at the commercial-band frequency of 13.56 MHz, supplies rf power to solid central or powered, planar electrode, 14, and metered gas source, 16, provides a high flow of chosen gases through the regions, 18a and 18b, between central electrode 14 and the grounded, planar electrically conducting walls 20a and 20b of chamber, 22. Use of this conventional excitation frequency, which is also the working frequency of plasma processing equipment for the semiconductor industry, is highly desirable, as power supplies, cables, and connectors are relatively inexpensive and widely available. Moreover, unregulated operation at this frequency is permitted by the Federal communications Commission. The gas exits through open end, 23, in chamber 22. Metastable and other reactive species have been observed in a plume extending up to 8" from the end of the grounded chamber. The material to be treated is placed in this plume. Grounded nozzle, 24, increases the velocity of the exiting plasma gases and assists localizing their extent. Planar electrode 14 is supported a uniform distance away from grounded, conducting walls 20a and 20b by quartz or ceramic electrical insulators, 24a and 24b shown in FIG. 1b, which shows a sectional view (Section B—B) from the front of the apparatus. Also shown in FIG. 1b are the rounded edges, 26a and 26b of conducting wall 20a, and those, 28a and 28b of conducting wall 20b. Grounded electrodes 20a and 20b are cooled by water circulated therethrough by water connections 30a and 30b, and 32a and 32b. FIG. 1c shows a top view of the apparatus and identifies the sectional views. Operation at atmospheric pressure is stable, repeatable, and both plasma discharges are easily ignited. Atmospheric operation also produces much higher conversion of gas-phase reactive metastable species than would be expected by linearly extrapolation from low-pressure discharge operation. Unlike plasma torches, the present apparatus produces a gas-phase effluent no hotter than about 250° C. at an rf power of 300 W, and shows distinct non-thermal characteristics as measured by spectroscopic analysis inside the source. Arcing is prevented in the present apparatus by using He gas mixtures, which limit ionization, by using high flow velocities, and by properly shaping the rf-power electrode. For a He/$O_2$ mixture, a 4. in×4 in.×¼ in. rf-powered stainless steel electrode at between 250 and 1500 W of 13.56 MHz radiofrequency power, a He flow rate of between 25 and 50 slpm, and an $O_2$ flow rate of between 0.125 and 1.5 slpm at atmospheric pressure, etching rates of polyimide films were found to be between 0.5 and 3.5 $\mu$m/min. Radiofrequency voltages of up to approximately 350 V could be applied to the rf-powered electrode for a spacing between this electrode and the conducting walls of 1/16 in. For single-discharge (one-sided) plasma operation of the apparatus of the present invention, dielectric material may be placed in either of volumes 18a or 18b to block the flow of gas thereinto, or the spacing between the rf-powered electrode and the conducting wall of the volume which is to have no discharge may be made sufficiently large such that a plasma discharge does not form therein. There is evidence that indicates that electron density required for plasma sustenance is increased by minimizing electron losses by electron trapping by means of the hollow cathode effect; that is, by sheath repulsion at all surfaces, except in the axial flow direction, and by operation in a γ-mode (See, e.g., *Principles of Plasma Discharges and Materials Processing,* by M. A. Liebermann and A. J. Lichtenberg, Wiley, pp 367–368 (1994).) in which the electron losses are compensated for by the combination of secondary electron emission and photoelectric emission from the ground and powered metal surfaces. FIGS. 2a–2c show a segmented rod embodiment of the present invention which is expected to improve performance as a result of the hollow cathode effect. FIG. 2a is a schematic representation of a side sectional view (Section A—A) of the planar, multiple-rod center electrode, FIG. 2b is a sectional view (Section B—B) of the chamber from the front end thereof, while FIG. 2c is a top view thereof showing, in particular, the sectioning callouts.

Segmented rods, 34, are supported at their ends in slotted metal bars (not shown) which are held in place by the insulators 24a and 24b and electrically connected to rf power supply 12. The apparatus uses at least 17, ¼ in.-diameter, stainless steel rods mounted in a linear array for the rf-powered, center electrode. Gas enters the plasma jet through a fitting connected to a 0.5 in.-diameter bore which extends the width of the jet. This bore is used for feed gas pressure equalization. The feed gas flows out of the bore through a thin slit, which leads to the plasma zone in which the linear array of rods is mounted.

FIG. 3a is a schematic representation of a side sectional view (Section A—A) of the cantilever-mounted, planar, solid-plate center electrode, large-area atmospheric-pressure plasma jet embodiment of the present invention, FIG. 3b is a sectional view (Section B—B) of the chamber from the front end thereof, while FIG. 3c is a top view thereof showing, in particular, the sectioning callouts. Therein, solid electrode, 36, is supported at one end using insulated (Teflon) support block, 38. Radiofrequency energy is supplied to electrode 36 using power supply 12. This embodiment is more difficult to scale up because the center electrode is held using a cantilever configuration. As the length of the jet is increased, the center electrode may sag in support block 38 as the weight loading increases. This makes it more difficult to achieve a uniform or equal spacing between the rf-powered electrode and the planar, grounded electrodes. Where the gap is smaller, the discharge is more dense and arcing is more likely to occur. By using the embodiments shown in FIGS. 1 and 2 hereof this difficulty is avoided and the scaling enables the design and use of large area plasma sources as required for many industrial applications.

The absence of ions in the chamber exhaust prevents damage of the substrate and also increases etch or cleaning selectivity. The fast flow rate of the gas helps keep the temperature near 100° C. Other atmospheric pressure plasmas have been developed, but these are not uniform over large areas, or work at in excess of 10,000° C. Low process temperatures are required for the etching and cleaning of a wide variety of materials. Another advantage of the present invention is that etching rates are much higher than that achieved in other plasma processes.

The present invention, then, is capable of greater processing area and of handling greater rf power. To effect the desired scale-up, several guidelines are used: (1) the spacing between the powered and grounded electrodes is kept at a minimum of 0.0625 in. (however in some cases, greater gap distances are allowed as a function of longitudinal length-this is done to maintain the plasma conductivity at a nearly constant level); (2) as the cross-sectional area for flow is increased, the flow rate is also increased so that the linear velocity remains constant or greater than 34 feet/second (at 25° C. and 1 atm. pressure); and (3) the applied power density (units of watts/cm$^3$) is held constant or is increased as the gap volume between the two electrodes is scaled up. It is to be recognized that these scaling parameters are guidelines, and a considerable variations may occur in the practice of the present invention.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for generating a gaseous jet containing concentrations of reactive species from an atmospheric pressure plasma discharge which comprises in combination:
   (a) a chamber having a planar, grounded electrically conducting wall, a closed end and an open end;
   (b) a planar, conducting electrode located within said chamber disposed such that said planar electrode is spaced apart from and parallel to the planar, grounded electrically conducting wall of said chamber, thereby defining a volume;
   (c) means for flowing gases through the volume; and
   (d) means for supplying rf energy to said planar electrode such that an homogeneous, continuous plasma discharge occurs between said planar electrode and said planar, grounded electrically conducting wall of said chamber, whereby the gaseous products of the plasma discharge exit through the open end of said chamber at ambient pressure.

2. The apparatus for generating an atmospheric pressure plasma discharge as described in claim 1, wherein said planar, grounded electrically conducting wall of said chamber is cooled by liquid flowing therethrough.

3. The apparatus for generating an atmospheric pressure plasma discharge as described in claim 1, further comprising a nozzle located at the open end of said chamber for increasing the velocity of the gaseous products.

4. The apparatus for generating a gaseous jet containing concentrations of reactive species from an atmospheric pressure plasma discharge as described in claim 1, wherein the flowing gas includes a O$_2$/He mixture.

5. An apparatus for generating an atmospheric-pressure plasma discharge which comprises in combination:
   (a) a chamber having two opposing planar, spaced-apart and parallel grounded electrically conducting walls, a closed end, and an open end;
   (b) a planar, electrically conducting electrode located within said chamber disposed such that said planar electrode is equally distant from and parallel to the opposing electrically conducting walls thereof, defining thereby two volumes;
   (c) means for flowing gases through each of the two volumes; and
   (d) means for supplying rf energy to said planar electrode such that an homogeneous, continuous plasma discharge occurs between said planar electrode and each of the grounded electrically conducting walls of said chamber, whereby the gaseous products of the plasma discharge exit through the open end of said chamber at ambient pressure.

6. The apparatus for generating an atmospheric pressure plasma discharge as described in claim 5, wherein said planar, parallel, grounded electrically conducting walls of said chamber are cooled by liquid flowing therethrough.

7. The apparatus for generating an atmospheric pressure plasma discharge as described in claim 5, further comprising a nozzle located at the open end of said chamber for increasing the velocity of the gaseous products.

8. The apparatus for generating an atmospheric pressure plasma discharge as described in claim 5, wherein the flowing gas includes a O$_2$/He mixture.

9. A method for generating a gaseous jet containing concentrations of reactive species, which comprises the step of: generating an homogeneous, atmospheric pressure plasma discharge having no visibly observable arcs in a gas flowing through the region between a planar, electrically conducting wall of a chamber having a closed end and an open end, and a planar, electrically conducting electrode located within the chamber spaced apart from and parallel to the planar, electrically conducting wall thereof, thereby forming a volume therebetween, whereby gaseous products of the plasma discharge, including reactive species, exit through the open end of the chamber at ambient pressure.

10. The method for generating an atmospheric pressure plasma discharge as described in claim 9, wherein the planar, grounded electrically conducting wall of the chamber is cooled by liquid flowing therethrough.

11. The method for generating a gaseous jet containing concentrations of reactive species as described in claim 9, wherein the flowing gas includes a O$_2$/He mixture.

12. An apparatus for generating a gaseous jet containing concentrations of reactive species from an atmospheric pressure plasma discharge which comprises in combination:
   (a) a chamber having a plurality of alternating planar, grounded electrically conducting electrodes and planar, electrically conducting insulated electrodes located within said chamber disposed such that said grounded electrodes are spaced apart from and parallel to said planar, insulated electrodes, thereby defining a plurality of volumes, a closed end and an open end;
   (b) means for flowing gases through each of the plurality of volumes; and
   (c) means for supplying rf energy to each of said insulated electrodes such that an homogeneous, continuous plasma discharge occurs between each of said insulated electrodes and said grounded, electrically conducting electrodes nearest thereto, whereby the gaseous products of the plasma discharge exit through the open end of said chamber at ambient pressure.

13. The apparatus for generating an atmospheric pressure plasma discharge as described in claim 12, wherein said grounded, electrically conducting electrodes are cooled by liquid flowing therethrough.

14. The apparatus for generating an atmospheric pressure plasma discharge as described in claim 12, further comprising a nozzle located at the open end of said chamber for increasing the velocity of the gaseous products.

15. The apparatus for generating a gaseous jet containing concentrations of reactive species from an atmospheric pressure plasma discharge as described in claim 12, wherein the flowing gas includes a $O_2$/He mixture.

* * * * *